United States Patent
Chien et al.

(10) Patent No.: US 6,235,653 B1
(45) Date of Patent: May 22, 2001

(54) AR-BASED SI-RICH OXYNITRIDE FILM FOR DUAL DAMASCENE AND/OR CONTACT ETCH STOP LAYER

(75) Inventors: Hung-Ju Chien, Hsin-Chu; Yuan-Hung Chiu, Taipei; Wen-Kung Cheng, Foufen; Yin-Lang Wang, Tai chung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/324,924

(22) Filed: Jun. 4, 1999

(51) Int. Cl.[7] ............................. H01L 21/31; H01L 21/469
(52) U.S. Cl. ......................... 438/788; 438/769; 438/786
(58) Field of Search .................................. 438/786, 788, 438/769, 763

(56) References Cited

U.S. PATENT DOCUMENTS

| | | | |
|---|---|---|---|
| 4,901,133 | 2/1990 | Carran et al. | 357/54 |
| 5,578,523 | 11/1996 | Fiordalice et al. | 437/190 |
| 5,639,687 | 6/1997 | Roman et al. | 437/186 |
| 5,741,626 | 4/1998 | Jain et al. | 430/314 |
| 5,818,110 | 10/1998 | Crenin | 257/775 |
| 5,920,790 | * 7/1999 | Wetzel et al. | 438/618 |
| 6,127,238 | * 10/2000 | Liao et al. | 438/382 |

* cited by examiner

Primary Examiner—Richard Elms
Assistant Examiner—Bradley Smith
(74) Attorney, Agent, or Firm—George O. Saile; Stephen B. Ackerman; Rosemary L. S. Pike

(57) ABSTRACT

A new method of forming a plasma-enhanced silicon-rich oxynitride layer having improved uniformity across the wafer in terms of layer thickness, refractivity, and reflectivity by using argon as the inert carrier gas is described. A semiconductor substrate is provided which may include semiconductor device structures. An Argon-based silicon-rich oxynitride etch stop layer is deposited overlying the semiconductor substrate. An oxide layer is deposited overlying the Argon-based silicon-rich oxynitride etch stop layer. An opening is etched through the oxide layer stopping at the Argon-based silicon-rich oxynitride etch stop layer. Thereafter, the Argon-based silicon-rich oxynitride etch stop layer within the opening is removed. The opening is filled with a conducting layer. This Argon-based silicon-rich oxynitride layer has improved uniformity across the wafer in terms of layer thickness, refractivity, and reflectivity as compared with a helium-based silicon-rich oxynitride layer.

20 Claims, 6 Drawing Sheets

AR-BASED SI-RICH OXYNITRIDE FILM FOR DUAL DAMASCENE AND/OR CONTACT ETCH STOP LAYER

BACKGROUND OF THE INVENTION

1. Field of the Invention

The invention relates to a method of metallization in the fabrication of integrated circuits, and more particularly, to a method of forming an improved etch stop layer for metallization in the manufacture of integrated circuits.

2. Description of the Prior Art

In a common application for integrated circuit fabrication, a contact/via opening is etched through an insulating layer to an underlying conductive area to which electrical contact is to be made. A conducting layer material is deposited within the contact/via opening. The damascene and dual damascene processes have become a future trend in metallization. Trenches or vias and trenches are etched in an insulating layer. The trenches or vias and trenches are inlaid with metal to complete the contacts. In all of these processes, etch stop layers are required to accurately form the trenches and vias. Conventionally, a low pressure chemical vapor deposition (LPCVD) silicon oxynitride etch stop layer has been deposited using argon/helium as the carrier gas or a plasma-enhanced chemical vapor deposition (PECVD) silicon oxynitride etch stop layer has been deposited using helium as the carrier gas. There are a number of disadvantages to this conventional etch stop layer. Specifically, the uniformity across the wafer in terms of thickness, refractivity, and reflectivity of the oxynitride film is highly variable resulting in difficulty in etching and deposition.

U.S. Pat. No. 5,639,687 to Roman et al teaches forming a silicon-rich silicon nitride anti-reflective coating film using a LPCVD process. Oxynitride is not mentioned. U.S. Pat. No. 4,901,133 to Curran et al teaches forming a silicon-rich oxynitride film using a high temperature LPCVD process. U.S. Pat. No. 5,741,626 to Jain et al teaches a tantalum nitride etch stop and anti-reflective coating layer. U.S. Pat. No. 5,818,110 to Cronin shows a dual damascene process using a silicon nitride or silicon oxynitride etch stop layer. U.S. Pat. No. 5,578,523 to Fiordalice et al discloses a silicon nitride etch stop layer and an aluminum nitride polish stop layer deposited in the presence of helium or argon gas with no differentiation between the inert gases.

SUMMARY OF THE INVENTION

A principal object of the present invention is to provide an effective and very manufacturable method of forming a silicon-rich oxynitride etch stop layer in the fabrication of integrated circuit devices.

Another object of the invention is to provide a method of forming a PECVD silicon-rich oxynitride layer having improved uniformity across the wafer in terms of layer thickness, refractivity, and reflectivity.

A further object of the invention is to provide a method of forming a PECVD silicon-rich oxynitride layer using argon as the inert carrier gas in the fabrication of integrated circuits.

Yet another object of the invention is to provide a method of forming a silicon-rich oxynitride layer having improved uniformity across the wafer in terms of layer thickness, refractivity, and reflectivity by using argon as the inert carrier gas.

In accordance with the objects of this invention a new method of forming a PECVD silicon-rich oxynitride layer having improved uniformity across the wafer in terms of layer thickness, refractivity, and reflectivity by using argon as the inert carrier gas is achieved. A semiconductor substrate is provided which may include semiconductor device structures. An Argon-based silicon-rich oxynitride etch stop layer is deposited overlying the semiconductor substrate. An oxide layer is deposited overlying the Argon-based silicon-rich oxynitride etch stop layer. An opening is etched through the oxide layer stopping at the Argon-based silicon-rich oxynitride etch stop layer. Thereafter, the Argon-based silicon-rich oxynitride etch stop layer within the opening is removed. The opening is filled with a conducting layer. This Argon-based silicon-rich oxynitride layer has improved uniformity across the wafer in terms of layer thickness, refractivity, and reflectivity as compared with a helium-based silicon-rich oxynitride layer.

BRIEF DESCRIPTION OF THE DRAWINGS

In the accompanying drawings forming a material part of this description, there is shown.

DESCRIPTION OF THE PREFERRED EMBODIMENTS

The present invention provides a method for forming a PECVD silicon-rich oxynitride etch stop layer in the fabrication of integrated circuits. The first preferred embodiment of the present invention shows a dual damascene metallization method in which the etch stop layer of the present invention is to be used. FIGS. 1 through 7 illustrate this example. The second preferred embodiment of the invention is described with reference to FIGS. 8 through 11 and addresses the contact etch case. It will be understood by those skilled in the art that the process of the present invention is not limited to the embodiments described in detail herein, but may be used in any application in which an oxynitride layer is to be formed as an etch stop layer.

Figure 1:
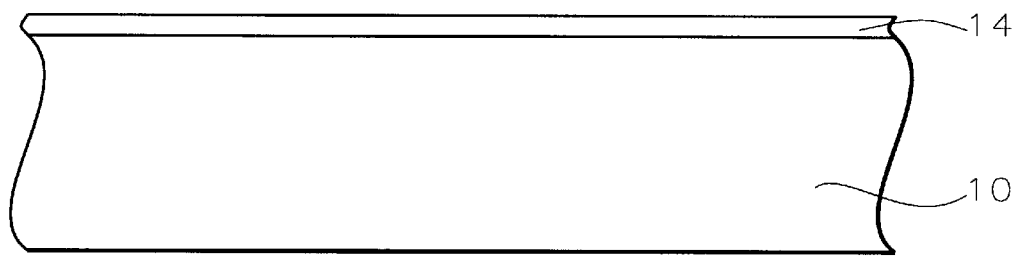
FIGS. 1 through 7 schematically illustrate in cross-sectional representation a first preferred embodiment of the present invention.

The first embodiment will now be described with reference to FIGS. 1 through 7. A dual damascene process will be described. It is to be understood that a single damascene process may be used instead of the illustrated dual damascene process. Referring now more particularly to FIG. 1, there is illustrated a portion of a partially completed integrated circuit device. There is shown a semiconductor substrate 10, preferably composed of monocrystalline silicon. Semiconductor device structures, such as gate electrodes and source and drain regions, not shown, may be formed in and on the semiconductor substrate. These semiconductor device structures are covered with an insulating layer such as silicon oxide. The silicon substrate, semiconductor device structures and insulating layer thereover are represented by 10 in FIG. 1.

The first etch stop layer is now to be formed by the process of the invention. The etch stop layer must have high etch selectivity with respect to both silicon and silicon oxide; that is, typically silicon oxynitride. Silicon nitride is not a preferred etch stop layer because it cannot meet integration criteria. Silicon nitride has a dielectric constant that is too high and there is the possibility that some of the layer will remain after etching or that it may cause silicon substrate damage.

Quality control of the etch stop layer film is important. Thickness uniformity is important for etching. The final uniformity of the wafer in terms of etch loss of the underlayer depends upon the film thickness uniformity and the etch uniformity. Reflectivity and refractivity uniformity are important in photolithography, such as for critical dimension control. For integration concerns, the etch stop layer must be evaluated in terms of its effect on RC delay, photolithography, and etch loss.

Conventional silicon oxynitride deposition involves flowing $SiH_4$ and $N_2O$ gases along with helium as the carrier gas. The deposition is carried out in a PECVD reaction chamber at low temperature. If the ratio of $SiH_4:N_2O$ is greater than one, the resulting SiON film will be silicon-rich, resulting in improved etch selectivity. The inventors have measured the uniformity across the wafer in terms of film thickness, refractivity, and reflectivity for the conventional etch stop layer described above. The film thickness was 432 Angstroms with a variability of 3.53% across the wafer. The refractive index was 2.39 with a variability of 1.67% across the wafer. The reflectivity was 1.38 with a variability of 3.24% across the wafer. The etch time for a 400 Angstrom film was measured at 100 to 110 seconds for an average etch rate of approximately 240 Angstroms/minute.

Usually, changing the carrier gas flow rate does not effect film characteristics for the LPCVD process. However, the inventors have found that replacing the helium carrier gas with argon as the carrier gas in the PECVD process results in unexpected improvements in uniformity and etch rate.

The inventors formed their silicon-rich oxynitride etch stop layer 14 by flowing $SiH_4$ at between about 30 and 150 sccm, flowing N2O at between about 20 and 100 sccm, and flowing Argon at between about 500 and 3000 sccm. A pressure of 2 to 8 torr, radio frequency (RF) power of 50 to 150 watts, and temperature of 300 to 500° C. were maintained. Preferably, $SiH_4$ is flowed at 80 sccm, $N_2O$ is flowed at 35 sccm, and Argon is flowed at 1900 sccm. A pressure of 5 torr, radio frequency power of 80 watts, and temperature of 400° C. is preferred. This etch stop layer 14 typically has a thickness of between about 200 and 1000 Angstroms. In the process of the invention, the Argon gas acts mainly as a RF stabilizer and subordinately as a carrier gas.

The inventors have measured the uniformity across the wafer in terms of film thickness, refractivity, and reflectivity for the argon-based PECVD silicon-rich oxynitride etch stop layer of the invention. All of the measurements were made at 248 nm. The film thickness was 390 Angstroms with a variability of 0.75% across the wafer. The refractive index was 2.24 with a variability of 0.77% across the wafer. The reflectivity was 1.35 with a variability of 1.32% across the wafer. All of these measures of uniformity were improved over the measurements taken for the conventional helium-based etch stop film. The benefits of improved uniformity are controlled deposition and etching.

The etch time for a 400 Angstrom argon-based silicon-rich oxynitride film was measured at 80 seconds for an average etch rate of approximately 300 Angstroms/minute. This etch rate is about 25% higher than the etch rate of the helium-based etch stop layer. A higher etch rate results in improved machine utilization.

Additionally, argon is less expensive than helium resulting in lower chemical costs using the process of the invention.

Figure 2:
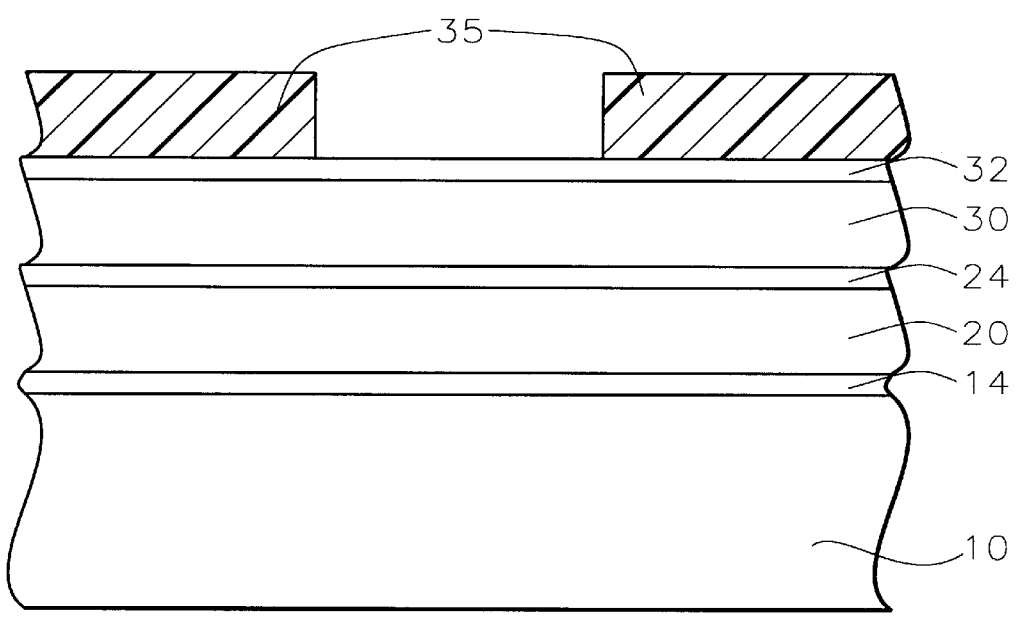

Returning to the dual damascene process example, after the argon-based silicon-rich oxynitride film 14 has been formed over the substrate, an insulating layer 20, composed of silicon dioxide or a low dielectric constant material is deposited over the etch stop layer 14 to a thickness of between about 200 and 1000 Angstroms, as shown in FIG. 2. A second argon-based PECVD silicon-rich oxynitride etch stop layer 24 and a second insulating layer 30 are deposited over the first insulating layer 20.

Figure 3:
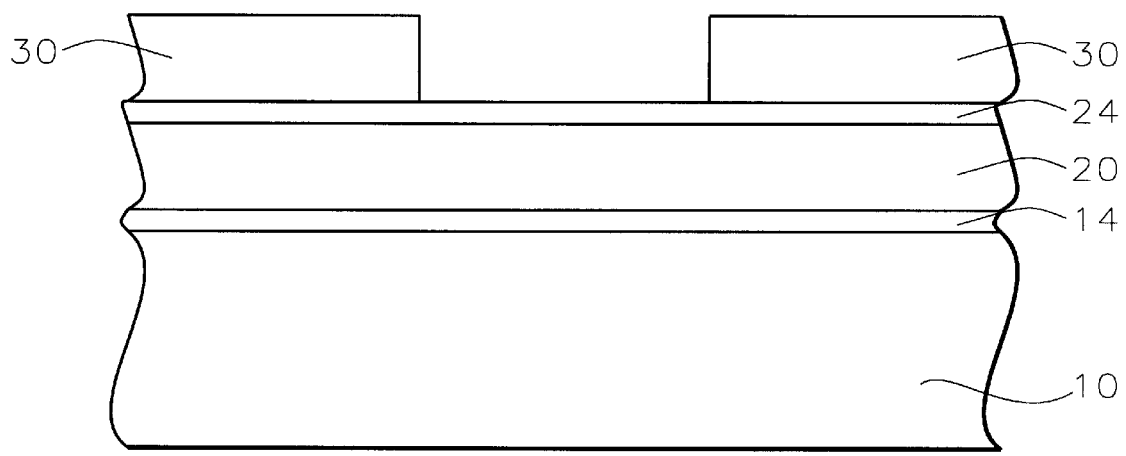

A hard mask layer 32 and a photoresist mask 35 are formed over the insulating layer 30. A dual damascene opening is etched through the insulating layers 30 and 20 using a typical two-mask process. For example, as illustrated in FIG. 3, a trench is etched through the second insulating layer 30 where it is not covered by the mask 35 and hard mask 32 with an etch stop at the argon-based silicon-rich oxynitride layer 24. The first photoresist mask 30 and hard mask 32 are removed.

Figure 4:
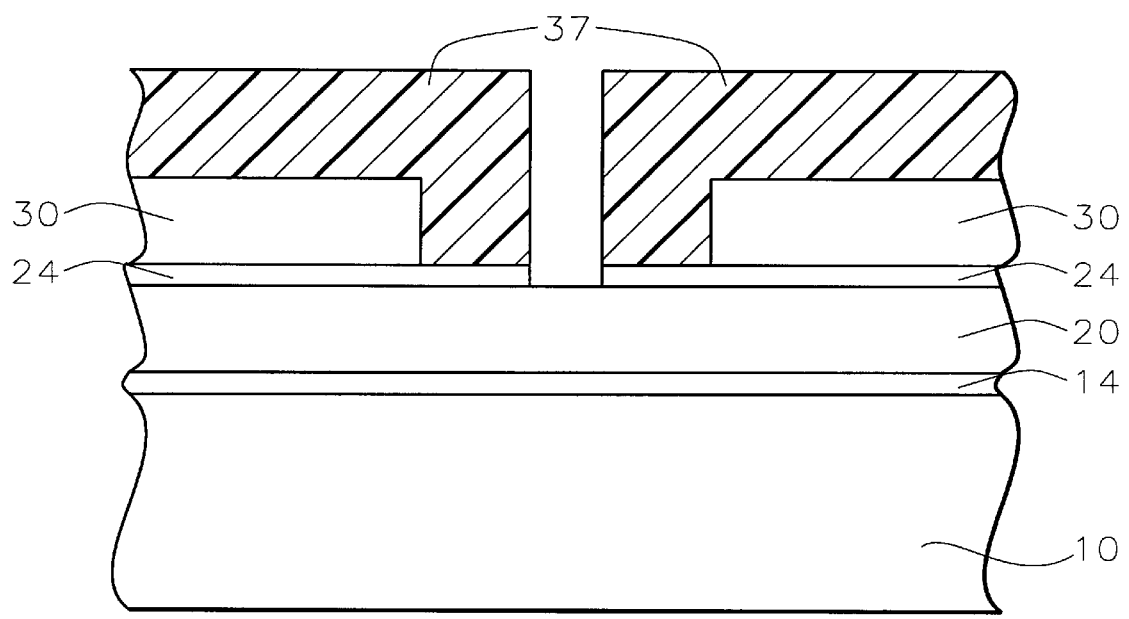
Figure 5:
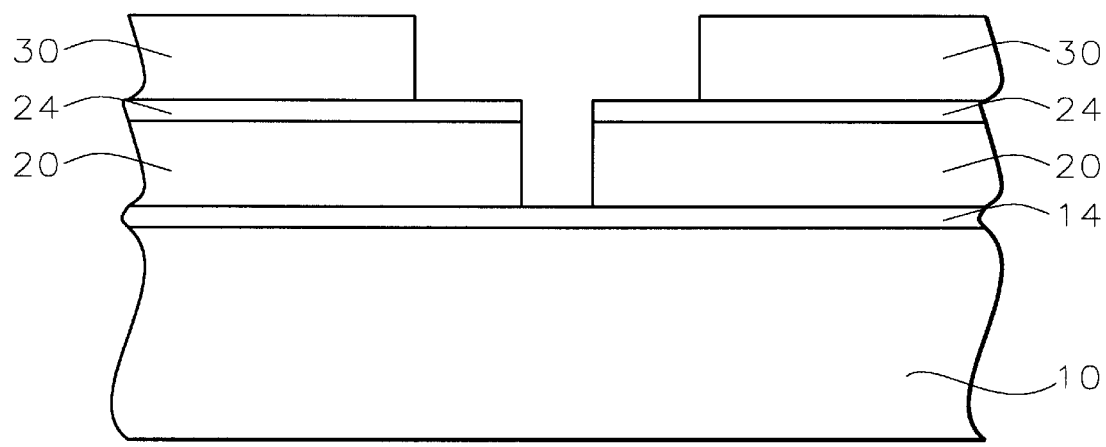
Figure 6:
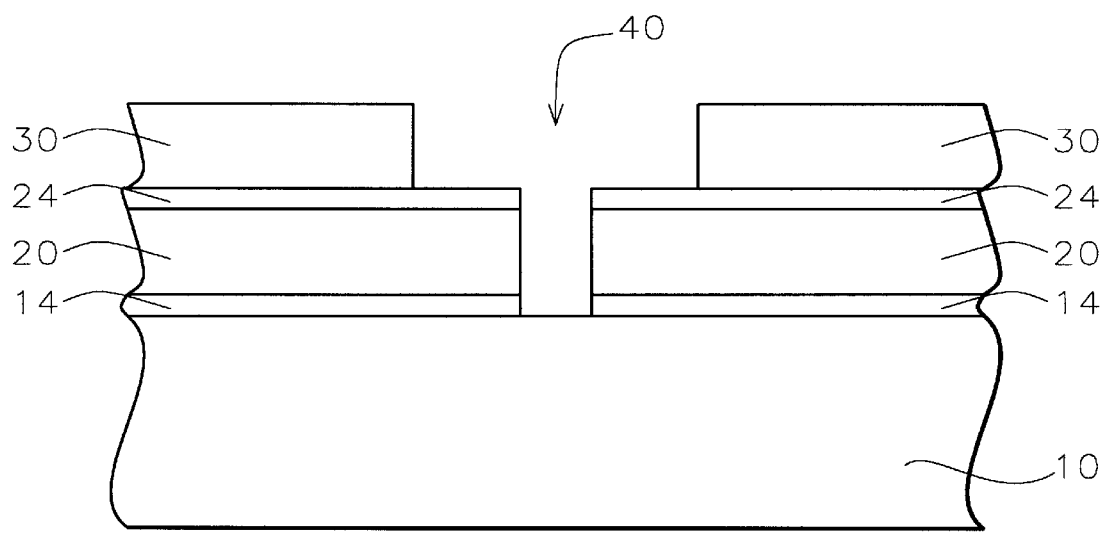

Next, a second photoresist mask 37 is formed as shown in FIG. 4. The etch stop layer 14 is removed where it is not covered by the mask 37. A via is etched through the first insulating layer 20 not covered by the mask 37 with an etch stop at the first argon-based silicon-rich oxynitride layer 14, as shown in FIG. 5. The mask 37 is removed. The first etch stop layer 14 is etched away to complete the dual damascene opening 40, shown in FIG. 6.

Figure 7:
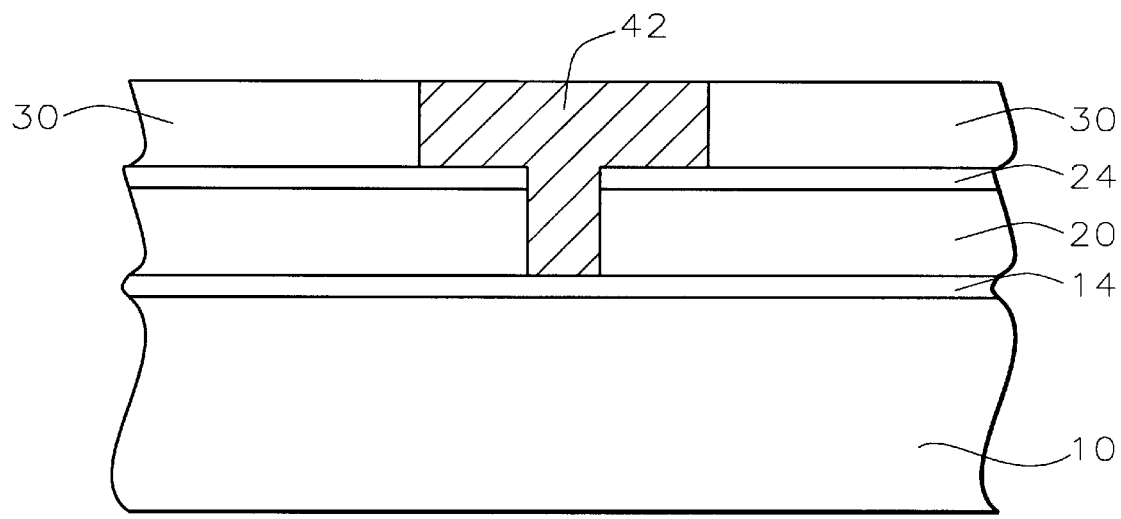

A metal layer is formed within the dual damascene opening according to a conventional process. For example, aluminum or copper may be deposited within the opening 40 and polished to complete the metal inlay 42, as illustrated in FIG. 7. Processing continues as is conventional in the art to complete fabrication of the integrated circuit device.

Figure 8:
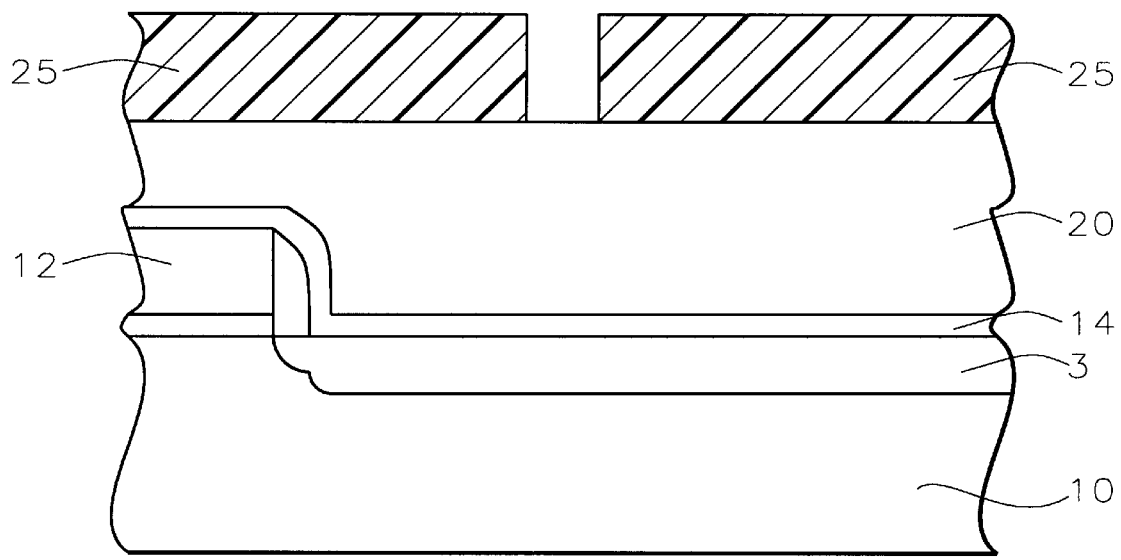
FIGS. 8 through 11 schematically illustrate in cross-sectional representation a second preferred embodiment of the present invention.

The second embodiment will now be described with reference to FIGS. 8–11. Referring now more particularly to FIG. 8, there is illustrated a portion of a partially completed integrated circuit device. There is shown a semiconductor substrate 10, preferably composed of monocrystalline silicon. Semiconductor devices structures, such as gate electrode 12 and source and drain regions 13, for example, are formed in and on the semiconductor substrate.

A contact etch is to be performed. First the argon-based PECVD silicon-rich oxynitride etch stop layer of the invention is formed over the semiconductor device structures and the substrate 10. As described above for the first embodiment, the etch stop layer of the invention is formed by flowing $SiH_4$ at between about 30 and 150 sccm, flowing $N_2O$ at between about 20 and 100 sccm, and flowing Argon at between about 500 and 3000 sccm. A pressure of 2 to 8 torr, radio frequency (RF) power of 50 to 150 watts, and temperature of 300 to 500° C. were maintained. Preferably, $SiH_4$ is flowed at 80 sccm, $N_2O$ is flowed at 35 sccm, and Argon is flowed at 1900 sccm. A pressure of 5 torr, radio frequency power of 80 watts, and temperature of 400° C. is preferred. This etch stop layer 14 typically has a thickness of between about 200 and 1000 Angstroms, and preferably about 400 Angstroms.

Next, an insulating layer 20 is formed over the etch stop layer. This may be silicon dioxide or a low dielectric constant material. The etch stop layer of the invention is necessary because a high etch selectivity to the insulating layer 20 or the silicon substrate 10 is needed. The etch stop layer of the invention provides better thickness, refractivity, and reflectivity uniformity than the conventional helium-based etch stop layer.

Figure 9:
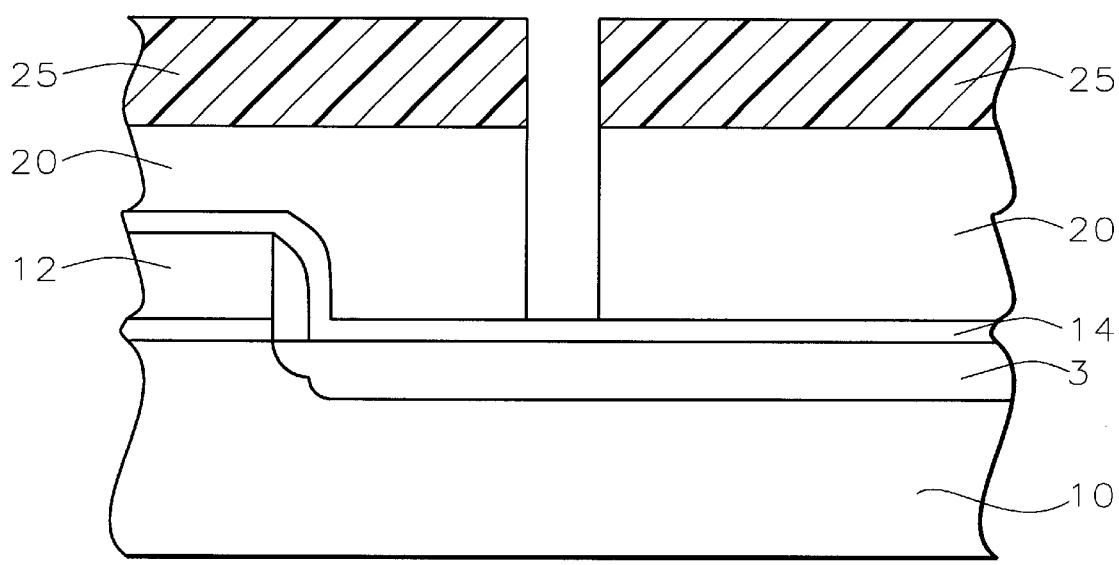
Figure 10:
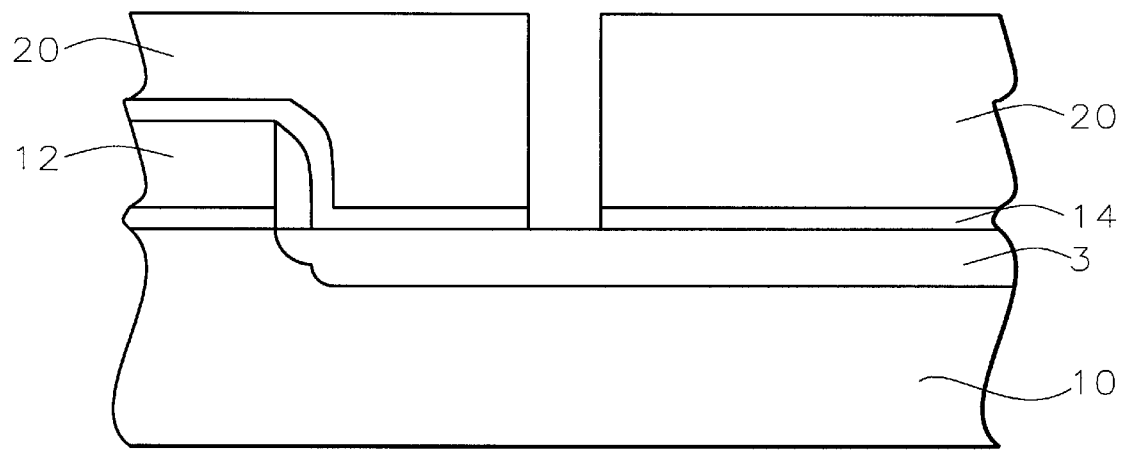
Figure 11:
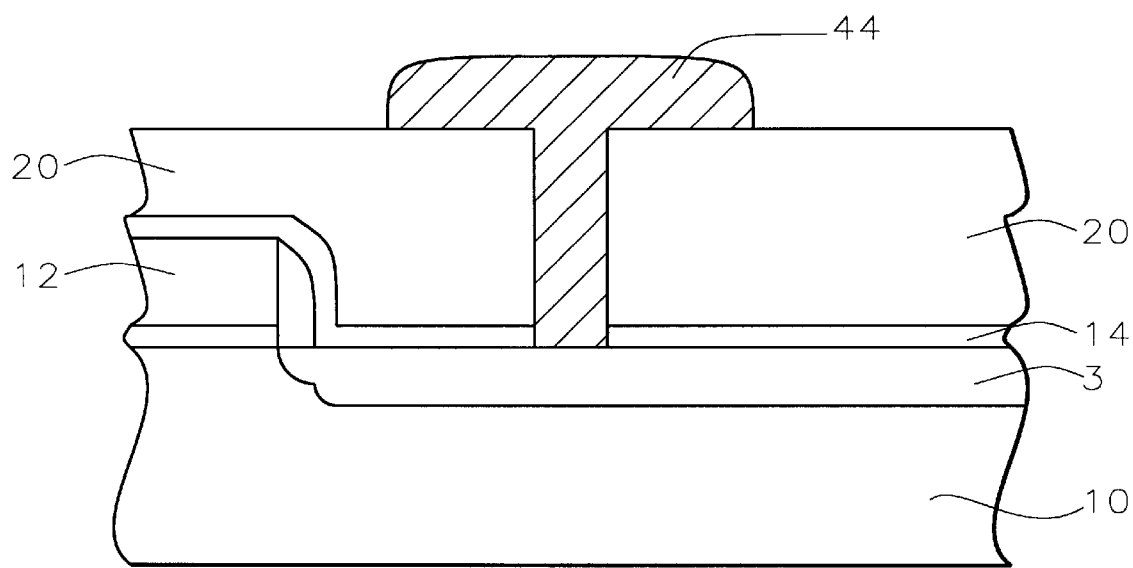

A photoresist mask 25 is formed over the insulating layer. Referring to FIG. 9, the insulating layer 20 is etched away where it is not covered by the mask 25 with an etch stop at the argon-based silicon-rich oxynitride layer 14 of the invention. Next, as shown in FIG. 10, the etch stop layer 14 is removed within the contact opening. The opening is filled with a conducting layer 44 which is patterned to complete the electrical connection, as shown in FIG. 11. Processing continues as is conventional in the art to complete fabrication of the integrated circuit.

The process of the invention results in an argon-based PECVD silicon-rich oxynitride etch stop layer. This layer has improved uniformity variability across the wafer in terms of thickness, refractivity, and reflectivity as compared with a helium-based silicon-rich oxynitride etch stop layer. The typical maximum variability for this invention is less than 1.5% for the refractive index variability, less than 2% for the reflectivity index variability, and less than 1.5% for the thickness variability. Argon is less expensive than helium and the higher etch rate of the argon-based layer as compared to the etch rate of the helium-based layer increases machine utilization.

The argon-based PECVD silicon-rich oxynitride etch stop layer of the invention can be used in any application in which an etch stop layer having excellent uniformity is desired, such as the dual damascene or contact etch processes. Since a low temperature of less than 500° C. is used for the PECVD process of the invention, this process can be used in all backend and frontend processes without adversely effecting thermal budget. Although helium and argon are common for LPCVD, their roles are limited mainly to carrier gases. There are no differences in film properties if either helium or argon is used in the LPCVD process if all other parameters are fixed. LPCVD processes are gradually losing favor for integrated circuit applications because of high process temperatures. Although helium gas has been used widely in PECVD silicon oxynitride film deposition, the inventors are pioneers in finding the differences and advantages of argon-based PECVD silicon-rich oxynitride films.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:
   providing a semiconductor substrate;
   depositing by plasma-enhanced chemical vapor deposition, using Argon as a radio frequency stabilizer and a carrier gas, a silicon-rich oxynitride etch stop layer overlying said semiconductor substrate;
   depositing an oxide layer overlying said silicon-rich oxynitride etch stop layer;
   etching an opening through said oxide layer stopping at said silicon-rich oxynitride etch stop layer;
   thereafter removing said silicon-rich oxynitride etch stop layer within said opening;
   filling said opening with a conducting layer; and completing said fabrication of said integrated circuit device.

2. The method according to claim 1 wherein said semiconductor substrate comprises semiconductor device structures including gate electrodes and associated source and drain regions formed in and on a silicon substrate.

3. The method according to claim 1 wherein said silicon-rich oxynitride etch stop layer is deposited by flowing $SiH_4$ at 30 to 150 sccm, flowing $N_2O$ at 20 to 100 sccm, and flowing Argon at 500 to 3000 sccm under pressure of 2 to 8 torr, radio frequency (RF) power of 50 to 150 watts, and temperature of 300 to 500° C. to form a film having a thickness of between about 200 and 1000 Angstroms.

4. The method according to claim 1 wherein said silicon-rich oxynitride etch stop layer is deposited by flowing $SiH_4$ at 80 sccm, flowing $N_2O$ at 35 sccm, and flowing Argon at 1900 sccm under pressure of 5 torr, radio frequency (RF) power of 80 watts, and temperature of 400° C. to form a film having a thickness of about 400 Angstroms.

5. The method according to claim 1 wherein said step of etching said opening through said oxide layer and said step of filling said opening comprises a contact etch process.

6. The method according to claim 1 wherein said step of etching said opening through said oxide layer and said step of filling said opening comprises a damascene process.

7. The method according to claim 1 wherein said silicon-rich oxynitride etch stop layer has an etch rate of about 300 Angstroms per minute.

8. The method according to claim 1 wherein said silicon-rich oxynitride etch stop layer has a maximum uniformity variability of less than 1.5% for refractive index variability, less than 2% for reflectivity index variability, and less than 1.5% for thickness variability.

9. A method of fabricating an intergrated circuit device comprising:
   providing semiconductor device structures in and on a semiconductor substrate covered by an insulating layer;
   depositing by plasma-enhanced chemical vapor deposition a first silicon-rich oxynitride etch stop layer overlying said insulating layer using Argon as a radio frequency stabilizer and a carrier gas;
   depositing a first oxide layer overlaying said first silicon-rich oxynitride etch stop layer;
   depositing by plasma-enhanced chemical vapor desposition a second silicon-rich oxynitride etch stop layer overlying said first oxide layer using Argon as a radio frequency stabilizer and a carrier gas;
   despositing a second oxide layer overlying said second silicon-rich oxynide etch stop layer;
   etching a dual damascene opening through said second and first oxide layers with etch stops at said second and first silicon-rich oxynitride etch stop layers and removing said second and first silicon-rich oxynitride etch stop layers within said dual damascene opening;
   filling said dual damascene opening with a conducting layer; and
   completing said fabricating of said intergrated circuit device.

10. The method according to claim 9 wherein said semiconductor device structures include gate electrodes and associated source and drain regions and first metallization layers.

11. The method according to claim 9 wherein said first and second silicon-rich oxynitride etch stop layers are deposited by flowing $SiH_4$ at 30 to 150 sccm, flowing $N_2O$ at 20 to 100 sccm, and flowing Argon at 500 to 3000 sccm under pressure of 2 to 8 torr, radio frequency power of 50 to 150 watts, and temperature of 300 to 500° C. to form a film having a thickness of between about 200 and 1000 Angstroms.

12. The method according to claim 9 wherein said silicon-rich oxynitride etch stop layer is deposited by flowing $SiH_4$ at 80 sccm, flowing $N_2O$ at 35 sccm, and flowing Argon at 1900 sccm under pressure of 5 torr, radio frequency (RF) power of 80 watts, and temperature of 400° C. to form a film having a thickness of about 400 Angstroms.

13. The method according to claim 9 wherein said silicon-rich oxynitride etch stop layer has an etch rate of about 300 Angstroms per minute.

14. The method according to claim 9 wherein said silicon-rich oxynitride etch stop layer has a maximum uniformity variability of less than 1.5% for refractive index variability, less than 2% for reflectivity index variability, and less than 1.5% for thickness variability.

15. A method of fabricating an integrated circuit device comprising:

provembed semiconductor device structures in and on a semiconductor substrate;

depositing by plasma-enhanced chemical vapor deposition a silicon-rich oxynitride etch stop layer overlying said semiconductor device structures using Argon as a radio frequency stabilizer and a carrier gas;

depositing an oxide layer overlying said silicon-rich oxynitride etch stop layer;

etching an opening through said oxide layer stopping at said silicon-rich oxynitride etch stop layer;

thereafter removing said silicon-rich oxynitride etch stop layer within said opening to expose one of said semiconductor device structures;

filling said opening with a conducting layer; and completing said fabrication of said integrated circuit device.

16. The method according to claim 15 wherein said semiconductor device structures include gate electrodes and associated source and drain regions.

17. The method according to claim 15 wherein said silicon-rich oxynitride etch stop layer is deposited by flowing $SiH_4$ at 30 to 50 sccm, flowing $N_2O$ at 20 to 100 sccm, and flowing Argon at 500 to 3000 sccm under pressure of 2 to 8 torr, power of 50 to 150 watts, and temperature of 300 to 500° C. to form a film having a thickness of between about 200 and 1000 Angstroms.

18. The method according to claim 15 wherein said silicon-rich oxynitride etch stop layer is deposited by flowing $SiH_4$ at 80 sccm, flowing $N_2O$ at 35 sccm, and flowing Argon at 1900 sccm under pressure of 5 torr, radio frequency (RF) power of 80 watts, and temperature of 400° C. to form a film having a thickness of about 400 Angstroms.

19. The method according to claim 15 wherein said silicon-rich oxynitride etch stop layer has an etch rate of about 300 Angstroms per minute.

20. The method according to claim 15 wherein said silicon-rich oxynitride etch stop layer has a maximum uniformity variability of less than 1.5% for refractive index variability, less than 2% for reflectivity index variability, and less than 1.5% for thickness variability.

* * * * *

UNITED STATES PATENT AND TRADEMARK OFFICE
CERTIFICATE OF CORRECTION

PATENT NO. : 6,235,653 B1
DATED : May 22, 2001
INVENTOR(S) : Hung-Ju Chien, Yuan-Hung Chiu, Wen-Kung Cheng, Yin-Lang Wang It is certified that error appears in the above-identified patent and that said Letters Patent is hereby corrected as shown below:

<u>Title page,</u>
Item [75], please delete "Foufen" and replace with -- Toufen --.

Signed and Sealed this

Twenty-sixth Day of March, 2002

*Attest:*

*Attesting Officer*

JAMES E. ROGAN
*Director of the United States Patent and Trademark Office*